(12) United States Patent
Kitano et al.

(10) Patent No.: US 6,633,022 B2
(45) Date of Patent: Oct. 14, 2003

(54) SUBSTRATE PROCESSING APPARATUS AND SUBSTRATE PROCESSING METHOD

(75) Inventors: Takahiro Kitano, Kikuchi-Gun (JP); Yuji Matsuyama, Kikuchi-Gun (JP); Junichi Kitano, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 20 days.

(21) Appl. No.: 09/819,865

(22) Filed: Mar. 29, 2001

(65) Prior Publication Data

US 2001/0025431 A1 Oct. 4, 2001

(30) Foreign Application Priority Data

Mar. 30, 2000 (JP) ........................................ 2000-093757

(51) Int. Cl.[7] ................................................. F27B 5/14
(52) U.S. Cl. ...................... 219/390; 219/405; 219/411; 118/724; 118/50.1; 118/719; 392/416; 392/418
(58) Field of Search ................................. 219/390, 405, 219/411; 392/416, 418; 118/724, 725, 50.1, 719, 715, 723 VE, 723 MP, 733, 50

(56) References Cited

U.S. PATENT DOCUMENTS 5,002,010 A * 3/1991 Weinberg .................... 118/719
6,002,108 A    12/1999 Yoshioka
6,215,106 B1 * 4/2001 Boas et al. .................. 219/390

FOREIGN PATENT DOCUMENTS

| DE | 42 00 038 | 10/1992 |
| DE | 4200038 | * 10/1992 |
| JP | 1-248529 | 10/1989 |
| JP | 4-192324 | 7/1992 |

* cited by examiner

Primary Examiner—Teresa Walberg
Assistant Examiner—Shawntina Fuqua
(74) Attorney, Agent, or Firm—Oblon, Spivak, McClelland, Maier & Neustadt, P.C.

(57) ABSTRACT

A controller controls the temperature of a hot plate and the degree of vacuum in a tightly closed space to a temperature and a pressure at levels at which a thinner contained in a resist applied to a wafer volatilizes and an acid generator, a quencher, and a polymer chain protecting group practically remain in the resist, for example, during heat processing. More specifically, the controller controls the temperature of the hot plate and the degree of vacuum in the tightly closed space to bring the temperature of the hot plate to about 40° C., and the degree of vacuum in the tightly closed space to approximately 5 Torr. Thereby, the heat processing can be performed for the wafer so that the acid generator is uniformly dispersed in the resist, or the quencher is uniformly formed on the front face of the resist without breakage of the polymer chain protecting group.

20 Claims, 8 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method each for performing heat processing, for example, for a semiconductor wafer immediately after it has been coated with a resist.

2. Description of the Related Art

In a photoresist process in semiconductor device fabrication, for example, a resist is applied to a substrate, for example, a semiconductor wafer (hereinafter, referred to as "a wafer") or the like, and is exposed to a predetermined pattern, and thereafter a developing solution is supplied to the wafer to perform developing processing.

Such processing is performed by a system constituted by connecting, for example, a coating and developing processing apparatus for performing resist coating and developing processing to an aligner. The coating and developing processing apparatus includes processing units for individually performing a series of processing necessary for coating and developing processing for a wafer, for example, hydrophobic processing (adhesion processing) for enhancing fixedness of a resist, resist coating processing for applying a resist, heat processing for heating the wafer after the resist coating to dry and cure the resist, heat processing for heating the wafer after exposure at a predetermined temperature, developing processing for performing developing processing for the wafer after the exposure, and the like, and the wafer is transferred between these processing units by a wafer transporter.

However, the aforesaid resist, for example, a chemically amplified resist, immediately after being applied onto the wafer contains an aid generator having a catalysis by, for example, a thinner which is a solvent or by photochemical reaction, a quencher which is a dissolution inhibitor, a polymer chain protecting group, and the like, and it is necessary to volatilize the thinner in particular out of these to cure the resist in a heat processing step after the resist coating.

In a typical heat processing step, however, the wafer is processed at a high temperature, causing a case in which the polymer chain protecting group is broken, the acid generator is not uniformly dispersed in the resist, or the quencher is not uniformly formed on the front face of the resist.

On the other hand, as a circuit pattern is made finer in recent years, there is a tendency to use, as a light source for exposure, a light source with an extremely short wavelength at a level of, for example, an $F_2$ laser light source, for example, 157 nm. If $O_2$, $O_3$, organic substances, $H_2O$, and the like are contained in the air during the exposure, light of such a light source with a short wavelength is absorbed by the substances and thus the amount of light from the light source reaching the resist extraordinarily decreases. On addition, in the above-described heat processing, $O_2$, $O_3$, and the like, strongly tend to adhere to the front face of the resist, thus causing exposure to be susceptible to failure due to the substances in the exposure step.

SUMMARY OF THE INVENTION

An object of the present invention is to provide a substrate processing apparatus and a substrate processing method capable of performing thermal processing for a substrate so that an acid generator is dispersed in a resist, or a dissolution inhibitor is uniformly formed on the front face of the resist without breakage of a polymer chain protecting group.

Another object of the present invention is to provide a substrate processing apparatus and a substrate processing method in which $O_2$, $O_3$, or the like is prevented from adhering to the front face of the resist after heat processing.

To attain the above-described objects, the substrate processing apparatus according to a first aspect of the present invention is a substrate processing apparatus for performing heat processing for a substrate coated with a resist containing at least one substance out of an acid generator, a dissolution inhibitor, and a polymer chain protecting group, and a solvent, comprising: a processing chamber having a space capable of being tightly closed; a plate disposed in the space for mounting thereon the substrate coated with the resist; a pressure reducing device for reducing a pressure in the tightly closed space; and a controller for controlling the pressure reducing device to hold a pressure at a level at which the solvent contained in the resist volatilizes and the substance practically remains in the resist.

The substrate processing apparatus according to a second aspect of the present invention is a substrate processing apparatus for performing processing for a substrate coated with a resist containing at least one substance out of an acid generator, a dissolution inhibitor, and a polymer chain protecting group, and a solvent, comprising: a processing chamber having a space capable of being tightly closed; a processing plate disposed in the space for processing the substrate coated with the resist at a room temperature or less; a pressure reducing device for reducing a pressure in the tightly closed space; and a controller for controlling a temperature of the processing plate and a degree of vacuum in the space to hold a temperature and a pressure at levels at which the solvent contained in the resist volatilizes, and the substance practically remains in the resist.

The substrate processing method according to a third aspect of the present invention is a method of performing heat processing for a substrate coated with a resist containing at least one substance out of an acid generator, a dissolution inhibitor, and a polymer chain protecting group, and a solvent, comprising the steps of: (a) performing heat processing for the substrate at a reduced pressure and a temperature at levels at which the solvent contained in the resist volatilizes and the substance practically remains in the resist; and (b) performing cooling processing for the processed substrate.

In the present invention, since, for example, the heat processing for the substrate is performed at a reduced pressure and a temperature at levels at which the solvent contained in the resist volatilizes and the acid generator, the dissolution inhibitor, and the polymer chain protecting group practically remain in the resist, the thermal processing can be performed for the substrate so that the acid generator is uniformly dispersed in the resist, or the dissolution inhibitor is uniformly formed on the front face of the resist.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, the preferred embodiments of the present invention will be explained with reference to the drawings.

Figure 1:
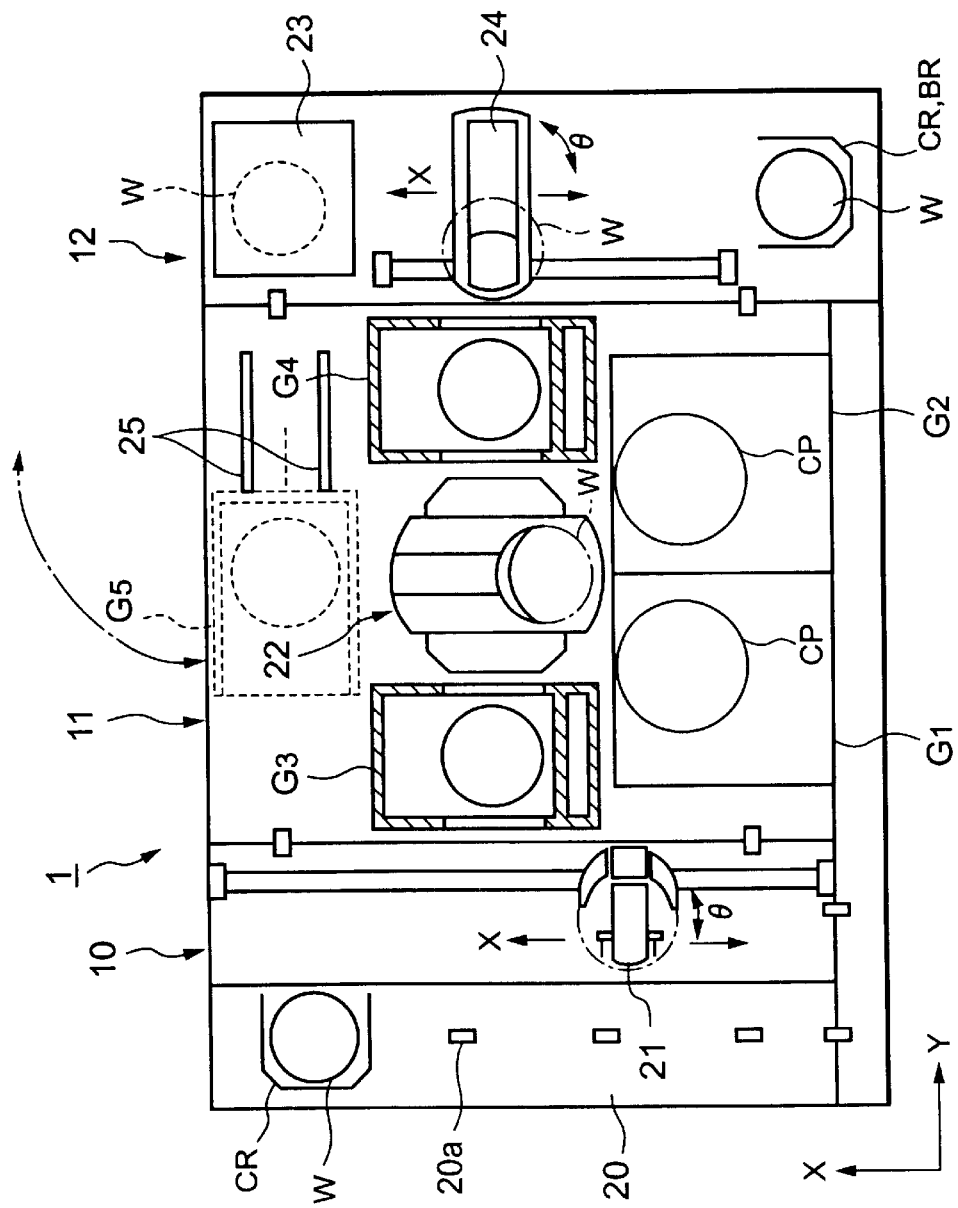
FIG. 1 is a plan view showing the entire configuration of a coating and developing processing system according to an embodiment of the present invention.
Figure 2:
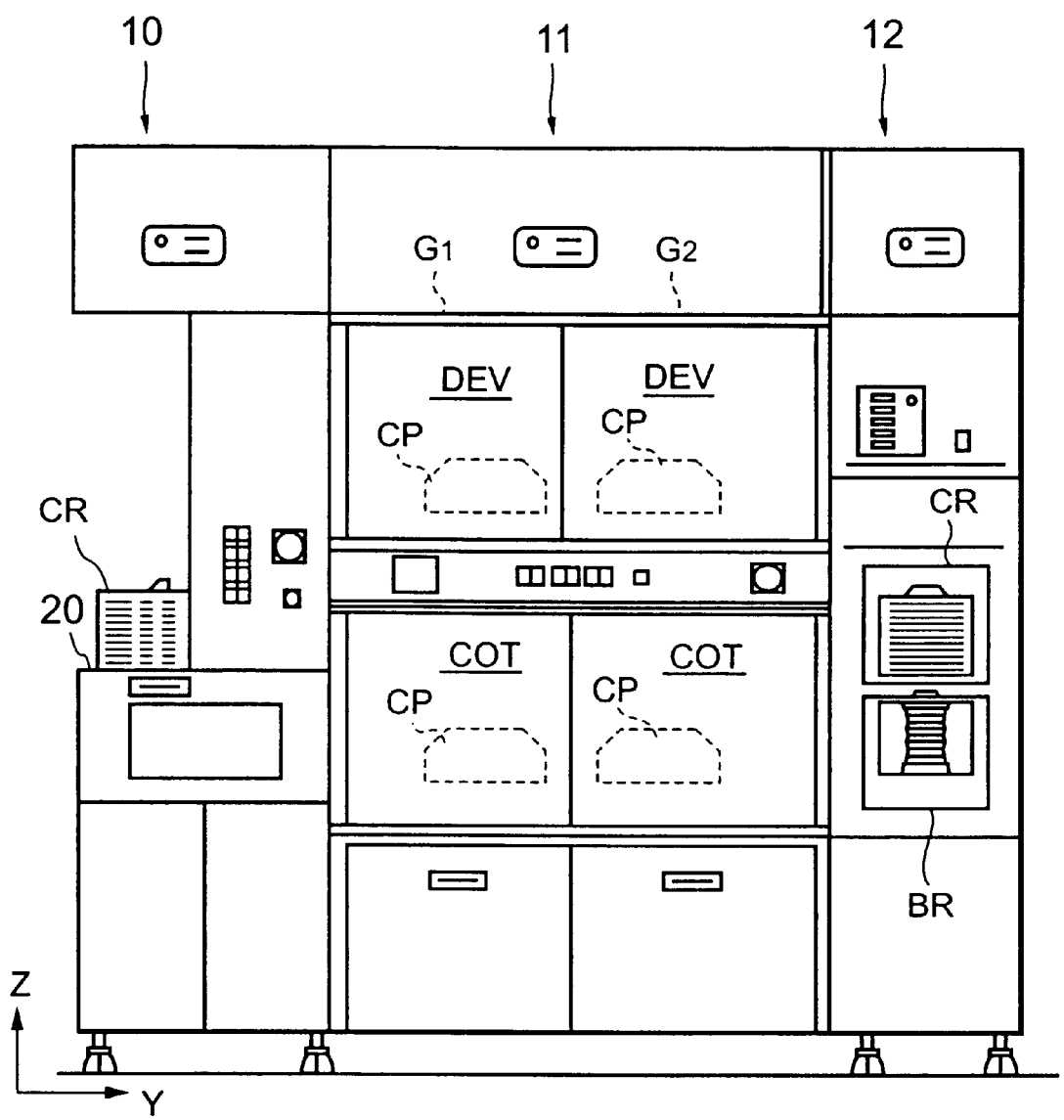
FIG. 2 is a front view of the coating and developing processing system shown in FIG. 1.
Figure 3:
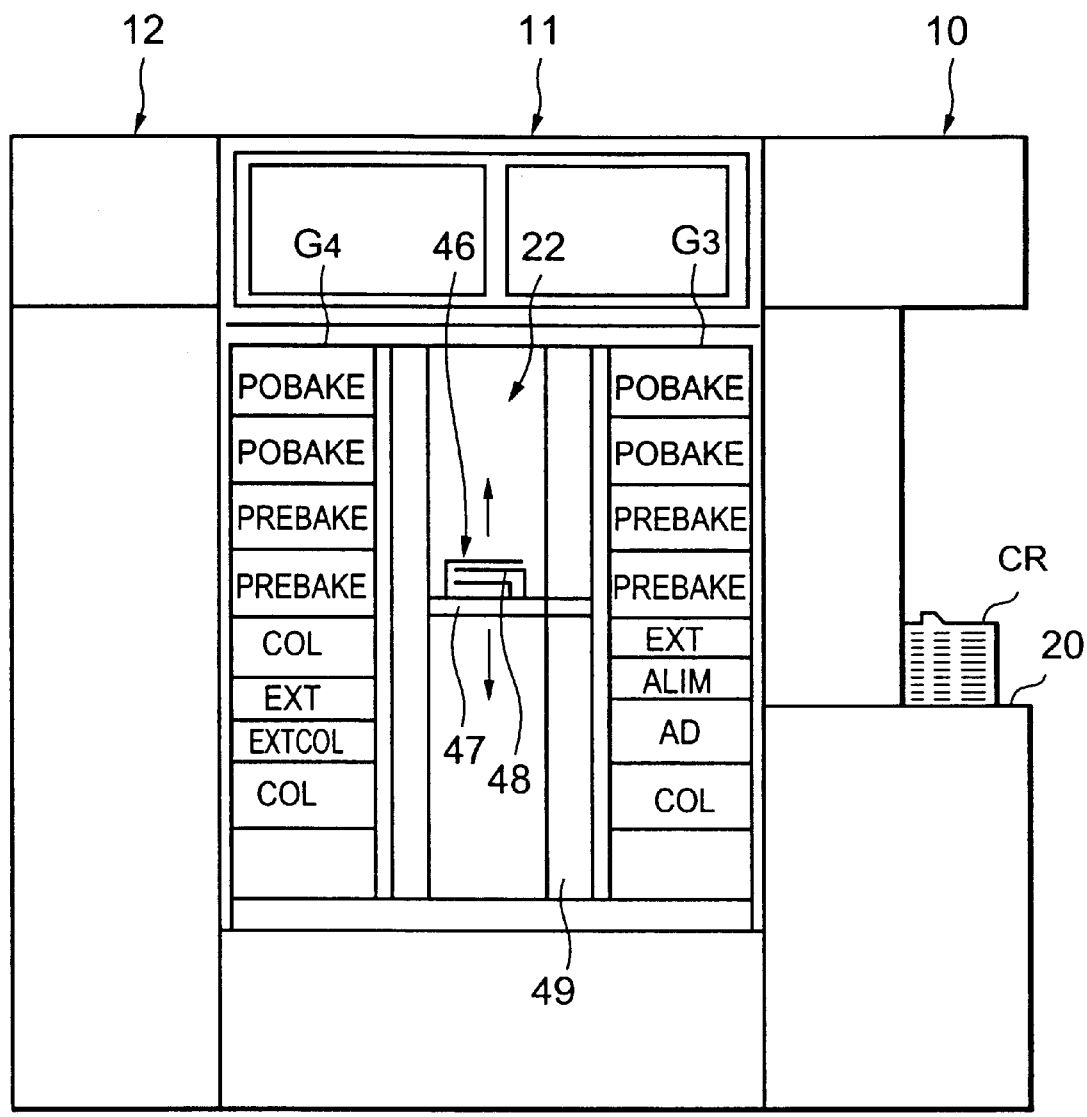
FIG. 3 is a rear view of the coating and developing processing system shown in FIG. 1.

FIG. 1 to FIG. 3 are views of the entire configuration of a coating and developing processing system 1 for a semiconductor wafer (hereinafter, referred to as "a wafer") according to an embodiment of the present invention, FIG. 1 is a plan view thereof, FIG. 2 a front view, and FIG. 3 a rear view respectively.

The coating and developing processing system 1 has a configuration in which, a cassette station 10 for carrying a plurality of, for example, 25 wafers W, as a unit, per wafer cassette CR from/to the outside into/out of the system and for carrying the wafer W into/out of the wafer cassette CR, a processing station 11 composed of various kinds of processing units multi-tiered at predetermined positions for performing predetermined processing for the wafers W one by one in coating and developing steps, and an interface station 12 for transferring the wafer W to/from an aligner (not shown) provided adjacent to the processing station 11, are integrally connected.

In the cassette station 10, as shown in FIG. 1, a plurality of, for example, up to four wafer cassettes CR are mounted at positions of positioning projections 20a on a cassette mounting table 20 in a line in an X-direction (the vertical direction in FIG. 1) with the respective wafer transfer ports facing the processing station 11 side, so that a wafer carrier 21 movable in a direction of arrangement of the cassettes (the X-direction) and in a direction of arrangement of the wafers (a Z-direction; the vertical direction) housed in the wafer cassette CR selectively gets access to each wafer cassette CR.

The wafer carrier 21 is configured to be rotatable in a θ-direction so as to get access also to an alignment unit (ALIM) and an extension unit (EXT) included in multi-tiered units of a third processing unit group G3 on the processing station 11 side as will be described later.

In the processing station 11, as shown in FIG. 1, a vertical-transport type main wafer transport mechanism 22 including a wafer transporter is provided, and all the processing units are arranged multi-tiered in one group or in a plurality of groups therearound.

The main wafer transport mechanism 22 is, as shown in FIG. 3, provided with a wafer transporter 46 ascendable and descendable in the vertical direction (the Z-direction) inside a cylindrical supporter 49. The cylindrical supporter 49 is connected to a rotation shaft of a motor (not shown), and rotates integrally with the wafer transporter 46 around the rotation shaft by rotational driving force of the motor, whereby the wafer transporter 46 is rotatable in the θ-direction. Incidentally, the cylindrical supporter 49 may be connected to another rotation shaft (not shown) which is rotated by the aforementioned motor.

The wafer transporter 46, including a plurality of holding members 48 movable in a longitudinal direction of a transport base 47, performs transfer of the wafer W between the processing units by the holding members 48.

Further, this embodiment has a configuration in which five processing unit groups G1, G2, G3, G4, and G5 can be arranged, multi-tiered units of the first and second processing unit groups G1 and G2 are disposed on the front side of the system (this side in FIG. 1), multi-tiered units of the third processing unit group G3 are disposed adjacent to the cassette station 10, multi-tiered units of the fourth processing unit group G4 are disposed adjacent to the interface station 12, and multi-tiered units of the fifth processing unit group G5 can be disposed on the rear side.

As shown in FIG. 2, in the first processing unit group G1, two spinner-type processing units, for example, a resist coating unit (COT) and a developing unit (DEV), each for performing predetermined processing for the wafer W mounted on a spin chuck inside a cup CP are two-tiered from the bottom in order. In the second processing unit group G2, two spinner-type processing units, for example, a resist coasting unit (COT) and a developing unit (DEV), are also two-tiered from the bottom in order. The resist coating units (COT) are preferably disposed at the lower tiers as described above because of difficulties in drainage of the resist solution in terms of both mechanism and maintenance. However, it is possible, of course, to dispose them at the upper tiers as required.

As shown in FIG. 3, in the third processing unit group G3, oven-type processing units each for performing predetermined processing for the wafer W mounted on a mounting table SP, for example, a cooling unit (COL) for performing cooling processing, an adhesion unit (AD) for performing so-called hydrophobic processing to enhance fixedness of the resist, an alignment unit (ALIM) for performing alignment, an extension unit (EXT), pre-baking units (PREBAKE) for performing heat processing before exposure processing, and post-baking units (POBAKE) for performing heat processing after the exposure processing are eight-tiered from the bottom in order. Also in the fourth processing unit group G4, oven-type processing units, for example, a cooling unit (COL), an extension and cooling unit (EXTCOL), an extension unit (EXT), a cooling unit (COL), pre-baking units (PREBAKE), and post-baking units (POBAKE) are eight-tiered from the bottom in order.

By virtue of the above-described arrangement of the cooling unit (COT) and the extension and cooling unit (EXTCOL) having low processing temperatures at the lower tiers and the pre-baking unit (PREBAKE), the post-baking unit (POBAKE), and the adhesion unit (AD) having processing temperatures higher than the above temperatures at the upper tiers, thermal mutual interference between the units can be reduced. Random multi-tiered arrangement is naturally suitable.

The interface station 12 has the same dimension as that of the processing station 11 in the depth direction (the X-direction), but is set to a size smaller than that in the width direction. A transportable pickup cassette CR and a fixed-type buffer cassette BR are two-tiered at the front of the interface station 12, whereas an edge aligner 23 is disposed at the rear, and a wafer carrier 24 is further disposed at the center. The wafer carrier 24 is configured to move in the X-direction and the Z-direction to get access to both the cassettes CR and BR, and the edge aligner 23. Moreover, the wafer carrier 24 is configured to be rotatable also in the θ-direction so as to be accessible to the extension unit (EXT) included in the multi-tiered units of the fourth processing unit group G4 of the processing station 11 side and also to a wafer transfer table (not shown) on the adjacent aligner side.

In the coating and developing processing system 1, the multi-tiered units of the fifth processing unit group G5 shown by a broken line can be provided, as described above, on the rear side of the main wafer transport mechanism 22. The multi-tiered units of the fifth processing unit group G5 are configured to shift along guide rails 25 laterally as seen from the main wafer transport mechanism 22. Accordingly, even when the multi-tiered units of the fifth processing unit group G5 are provided as shown in the drawing, a space can be obtained by sliding the multi-tiered units of the fifth processing unit group G5 along the guide rails 25, so that maintenance operation can be easily performed for the main wafer transport mechanism 22 from the back thereof. The space for the maintenance operation for the main wafer transport mechanism 22 can be easily secured not only by slide-shifting the multi-tiered units of the fifth processing unit group G5 linearly along the guide rails 25 as described above, but also by rotationally shifting them toward the outside of the system as shown by a reciprocating rotational arrow of a one-dotted chain line in FIG. 1.

Figure 4:
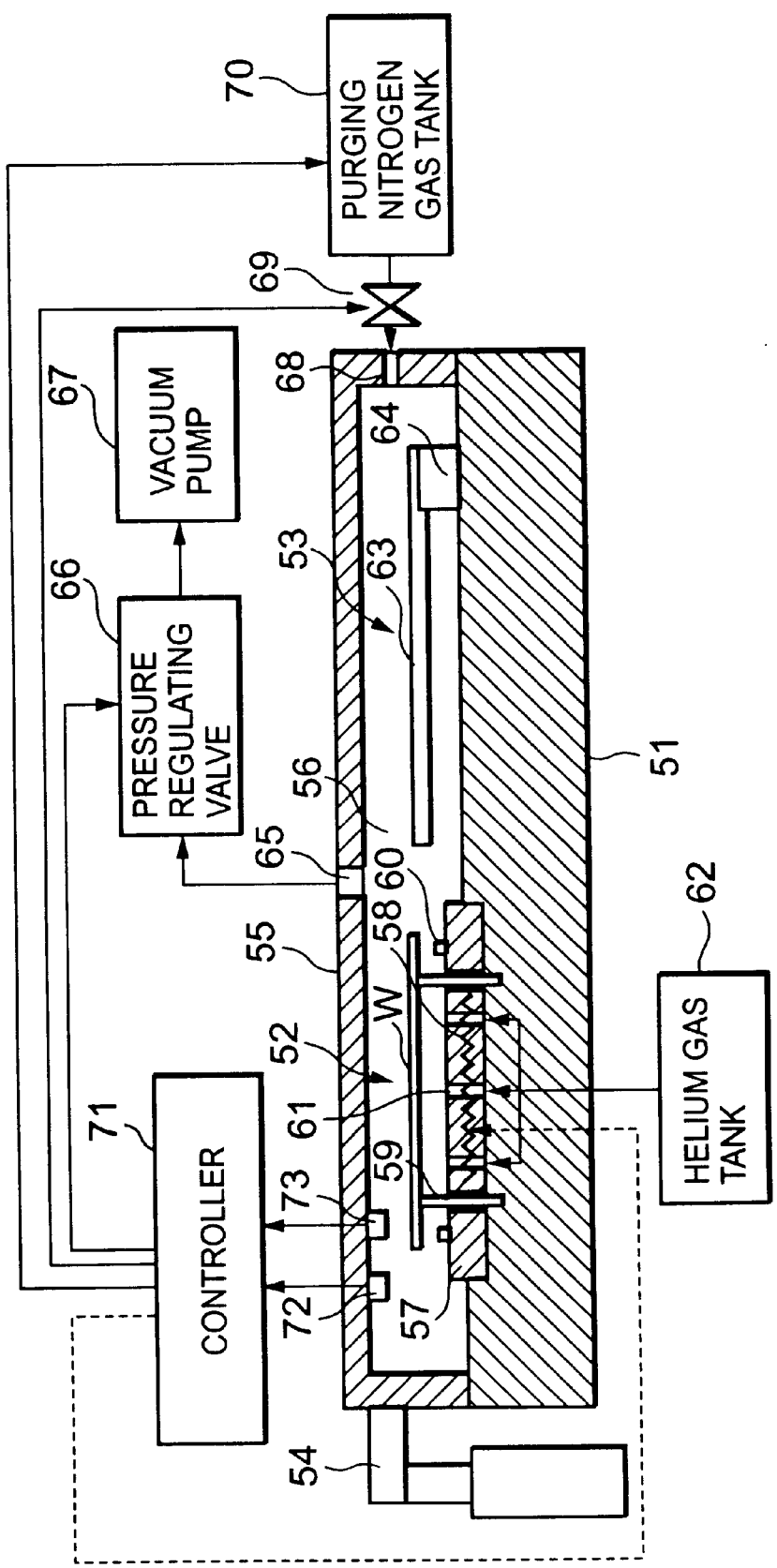
FIG. 4 is a substantially sectional view showing the entire configuration of a pre-baking unit according to an embodiment.

Next, the pre-baking unit (PREBAKE) in this embodiment will be explained. FIG. 4 is a substantially sectional view showing the entire configuration of the pre-baking unit (PREBAKE).

A main body 51 is divided into two of a heat processing portion 52 and a cooling processing portion 53. A lid body 55 which is raised and lowered by a raising and lowering mechanism 54 is disposed on the main body 51, and is lowered to cover the main body 51 to thereby form a tightly closed space 56 for processing the wafer W therein. Then, the pressure in the processing chamber can be reduced. The heat processing portion 52 and the cooling processing portion 53 are provided in the same tightly closed space 56 as described above, so that heat processing to cooling processing can be successively performed at a reduced pressure, preventing $O_2$, $O_3$, and the like from adhering to the front face of the resist after the heat processing.

At the heat processing portion 52, a hot plate 57 is disposed on the main body 51. For example, a heater 58 is embedded in the hot plate 57. Further, for example, three support pins 59 are provided capable of protruding and retracting from the front face of the hot plate 57. Furthermore, proximity pins 60 for holding/supporting the wafer W while keeping it a predetermined distance away from the front face of the hot plate 57 during the heat processing are provided on the front face of the hot plate 57. Moreover, the front face of the hot plate 57 is provided with injection ports 61, connected to, for example, a helium gas tank 62, for injecting helium gas, so that helium gas is injected from the injection ports 61 to a clearance between the hot plate 57 and the wafer W.

Helium gas is injected as described above, thereby improving heat conduction even at a reduced pressure to enable the heat processing to be performed efficiently.

Further, a cooling plate 63 in which a cooling element such as a Peltier element or the like is embedded is disposed at the cooling processing portion 53. The cooling plate 63 is movable to the heat processing portion 52 by a moving mechanism 64, so that the cooling plate 63 itself can transfer the wafer W supported by the support pins 59 of the heat processing portion 52. Note that, the cooling plate 63 may be provided with the same injection ports for injecting helium gas as those of the aforesaid hot plate 57.

The lid body 55 is provided with an exhaust port 65, to which a vacuum pump 67 is connected via a pressure regulating valve 66. The existence of the pressure regulating valve 66 in between enables gradual reduction in pressure, for example, from 10 Torr/sec to 300 Torr/sec, and more preferably, from 90 Torr/sec to 110 Torr/sec. This is because when pressure is reduced directly by the vacuum pump, the pressure abruptly decreases to cause bumping of the resist, resulting in its rough surface. The lid body 55 is further provided with an injection port 68 for injecting, for example, nitrogen gas which is an inert gas for purging. To this injection port 68 a nitrogen gas tank 70 is connected via a valve 69. The purge with nitrogen gas after the heat processing prevents $O_2$, $O_3$, and the like from adhering to the front face of the resist during subsequent cooling.

A controller 71 controls ON/OFF operation of the heater 58 and the cooling element, the opening/closing of the valves 66 and 69, the driving of other portions, and the like based on measurement results by a vacuum gauge 72 and a thermometer 73. The controller 71 controls the temperature of the hot plate 57 and the degree of vacuum in the tightly closed space 56 to a temperature and a pressure at levels at which a thinner contained in the resist applied to the wafer W volatilizes, and an acid generator, a quencher, and a polymer chain protecting group practically remain in the resist, for example, during the heat processing. More specifically, the controller 71 controls the temperature of the hot plate 57 and the degree of vacuum in the tightly closed space 56 to bring, for example, the temperature of the hot plate 57 to a range of about 40° C. to about 50° C., and the degree of vacuum in the tightly closed space 56 to approximately 5 Torr. The temperature and the pressure are controlled as described above, whereby the heat processing can be performed for the wafer W so that the acid generator is uniformly dispersed in the resist, or the quencher is uniformly formed on the front face of the resist without breakage of the polymer chain protecting group contained in the resist.

Next, the operation of the pre-baking unit (PREBAKE) structured as above will be explained.

Figure 5A:
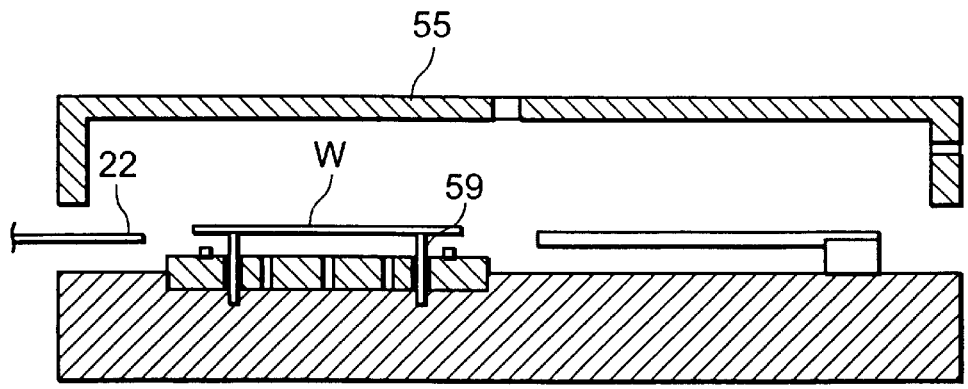
FIGS. 5A to 5D are views for explaining the operation of the pre-baking unit shown in FIG. 4.

As shown in FIG. 5A, the wafer W immediately after it has been coated with the resist is transferred onto the support pins 59 from the main wafer transport mechanism 22 with the lid body 55 raised and the support pins 59 protruding from the hot plate 57.

Figure 5B:
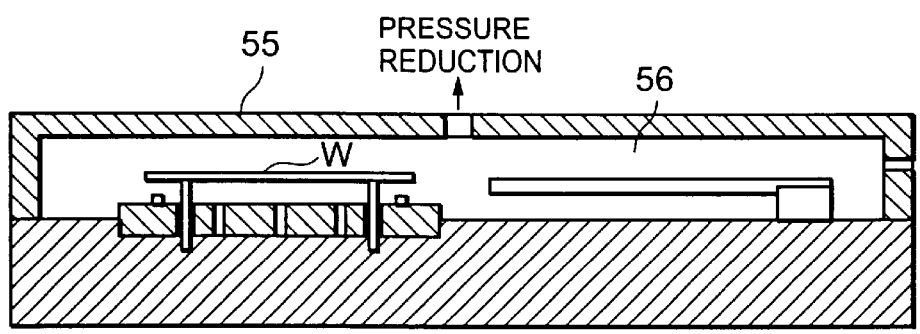

Then, as shown in FIG. 5B, the lid body 55 is lowered to form the tightly closed space 56, and the pressure inside the tightly closed space 56 is gradually reduced by the vacuum pump 67.

Figure 5C:
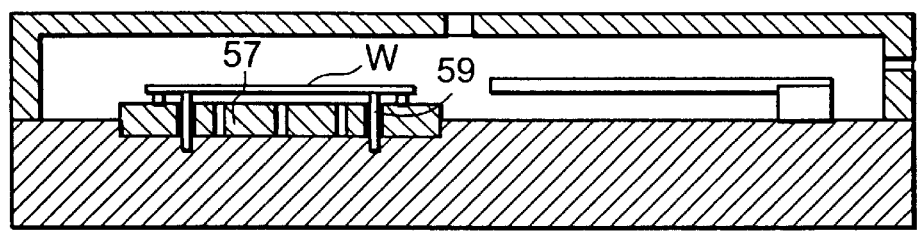

Then, as shown in FIG. 5C, the support pins 59 are lowered to thereby mount the wafer W on the hot plate 57, and then heat processing is started.

After the completion of the heat processing, nitrogen gas is injected from the injection port 68 to purge the inside of the tightly closed space 56 with the nitrogen gas, and the support pins 59 are raised.

Figure 5D:
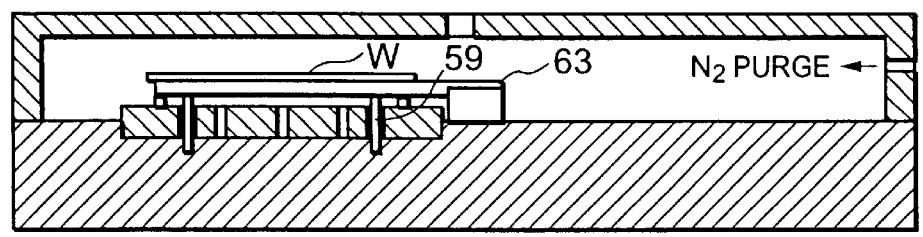

Then, as shown in FIG. 5D, the cooling plate 63 receives the wafer W from the support pins 59, and performs cooling processing. The cooling processing is performed at a temperature of, for example, 25° C. or less.

After the completion of the cooling processing, the wafer W is transferred from the cooling plate 63 via the support pins 59 to the main wafer transport mechanism 22 and then transported to the aligner to be subjected to exposure processing, and thereafter to developing processing.

Next, a substrate processing apparatus according to another embodiment of the present invention will be explained.

Figure 6:
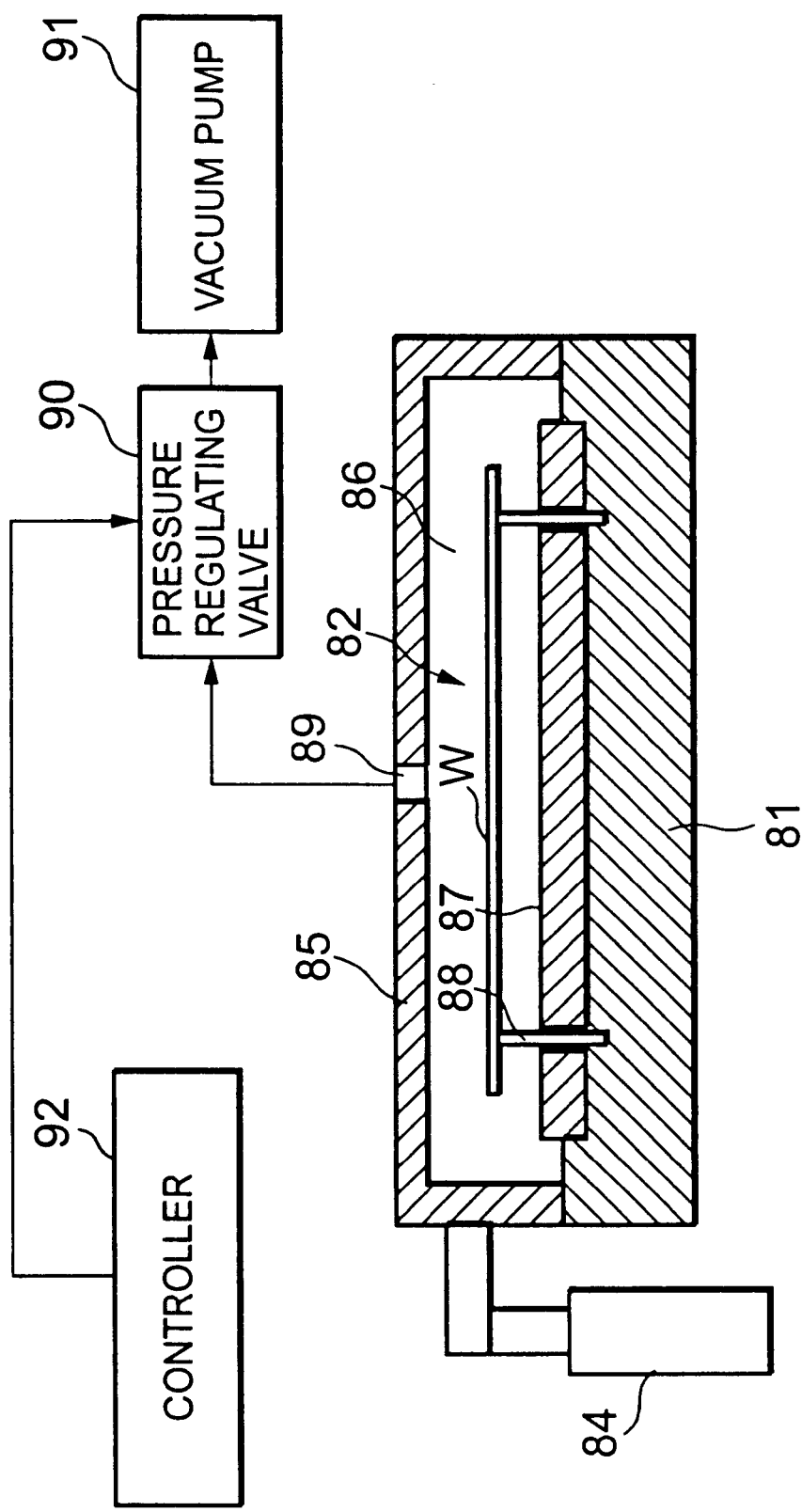
FIG. 6 is a substantially sectional view showing the entire configuration of a pre-baking unit according to another embodiment.

As shown in FIG. 6, a main body 81 only has a cooling processing portion 82. A lid body 85 which is raised and lowered by a raising and lowering mechanism 84 is disposed on the main body 81 and is lowered to cover the main body 81 to thereby form a tightly closed space 86 for processing the wafer W therein.

A cooling plate 87 in which a cooling element, for example, a Peltier element or the like is embedded is disposed on the main body 81. Further, for example, three support pins 88 are provided capable of protruding and retracting from the front face of the cooling plate 87. The support pins 88 are raised and lowered by a raising and lowering mechanism of which the illustration is omitted.

The lid body 85 is provided with an exhaust port 89, to which a vacuum pump 91 is connected via a pressure regulating valve 90.

A controller 92 controls ON/OFF operation of the cooling element, the opening/closing of the valve 90, the driving of other portions, and the like. The controller 92 controls the temperature of the cooling plate 87 and the degree of vacuum in the tightly closed space 86 to a temperature and a pressure at levels at which a thinner contained in the resist applied to the wafer W volatilizes, and an acid generator, a quencher, and a polymer chain protecting group practically remain in the resist, for example, during the processing. More specifically, the controller 92 controls the temperature of the cooling plate 87 and the degree of vacuum in the tightly closed space 86 to bring, for example, the temperature of the cooling plate 87 to about 23° C., and the degree of vacuum in the tightly closed space 86 to approximately 2 Torr, or to bring the temperature of the cooling plate 87 to about 15° C., and the degree of vacuum in the tightly closed space 86 to approximately 1 Torr. The temperature and the degree of vacuum are controlled as described above, whereby the resist can be cured without heat processing. Accordingly, the wafer W can be processed so that the acid generator is uniformly dispersed in the resist, or the quencher is uniformly formed on the front face of the resist without breakage of the polymer chain protecting group contained in the resist. In this embodiment, cooling processing thereafter becomes unnecessary in particular.

Next, a substrate processing apparatus according to still another embodiment of the present invention will be explained.

Figure 7:
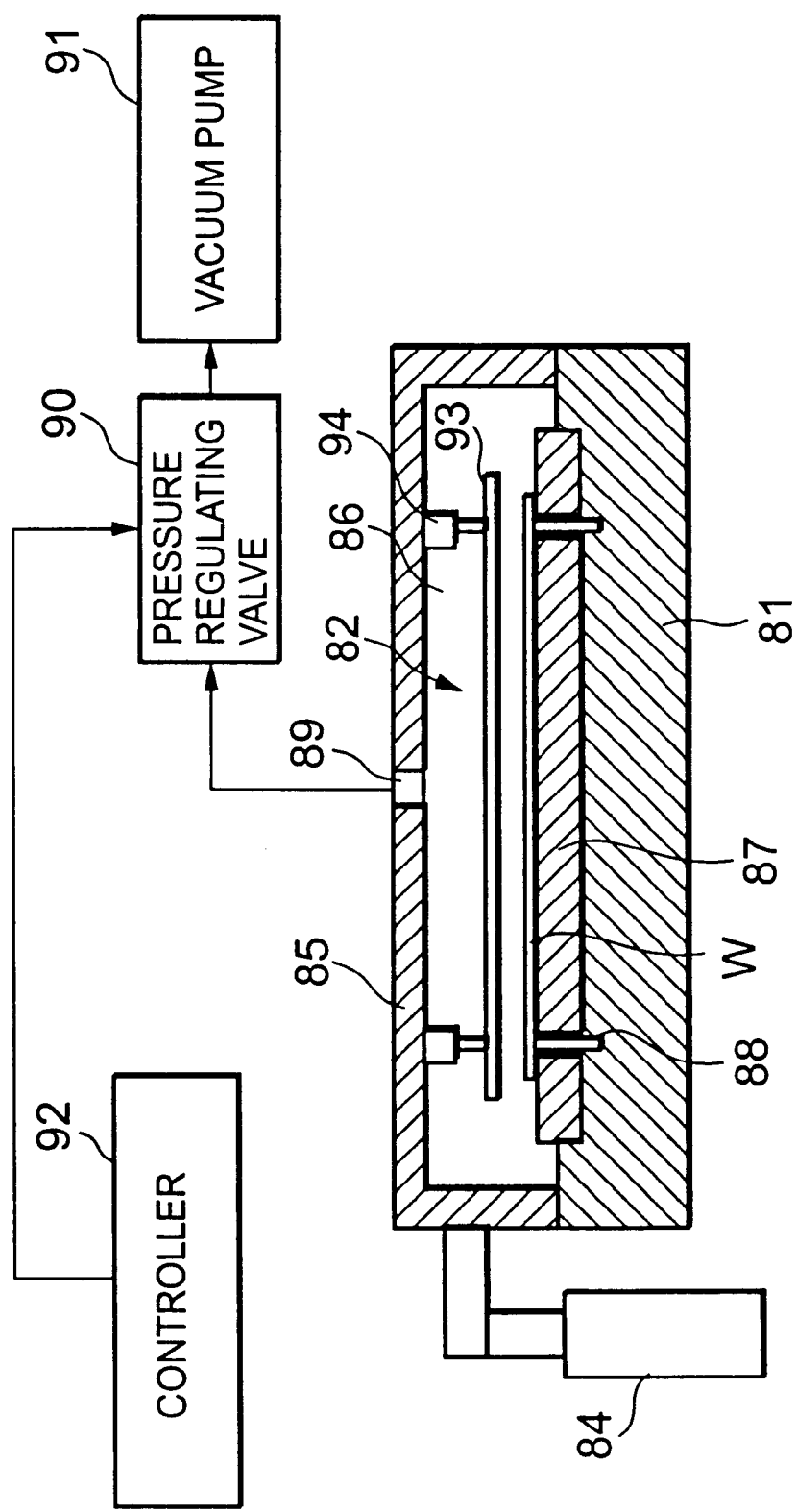
FIG. 7 is a substantially sectional view showing the entire configuration of a pre-baking unit according to still another embodiment.

As shown in FIG. 7, this substrate processing apparatus is constituted by further providing an opposing member 93 in the substrate processing apparatus shown in FIG. 6. The opposing member 93 is made of a material with a low heat conductivity, for example, high density polyethylene, crystal, or the like and disposed to oppose the wafer W mounted on a cooling plate 87. Further, a lid body 85 is provided with a raising and lowering mechanism 94 for raising and lowering the opposing member 93 in synchronization with ascent and descent of support pins 88. More specifically, together with the descent of the support pins 88, the opposing member 93 is also lowered to come closer to the wafer W mounted on the cooling plate 87 to, for example, about 1 mm apart.

The opposing member 93 made of a material with a low heat conductivity is allowed to come closer to the wafer W during the processing as described above to thereby make the temperature distribution within the wafer W uniform during the processing, whereby the wafer W can be processed so that the acid generator is uniformly dispersed in the resist, or the quencher is uniformly formed on the front face of the resist.

Next, a substrate processing apparatus according to yet another embodiment of the present invention will be explained.

Figure 8:
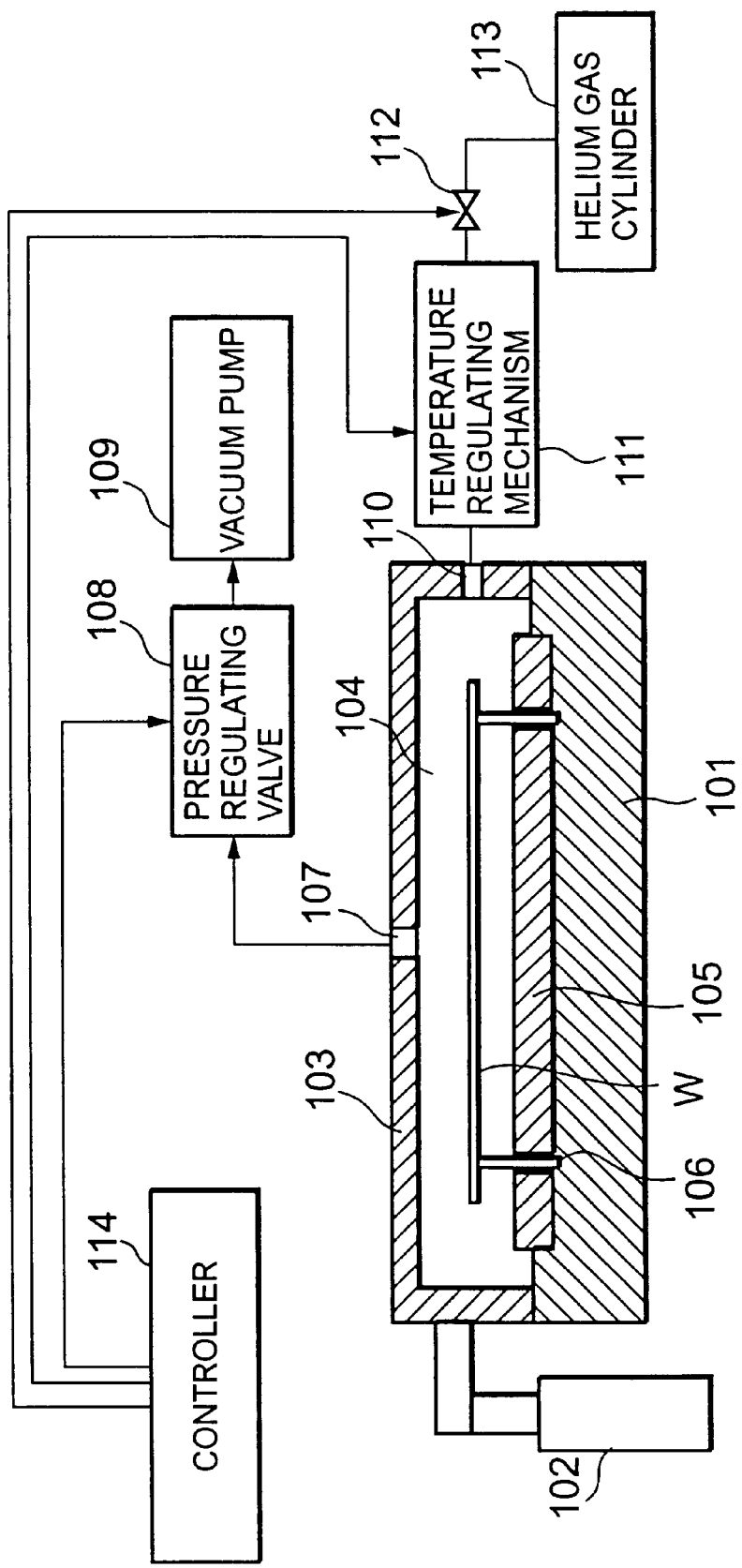
FIG. 8 is a substantially sectional view showing the entire configuration of a pre-baking unit according to yet another embodiment.

As shown in FIG. 8, a lid body 103 which is raised and lowered by a raising and lowering mechanism 102 is disposed on a main body 101 and is lowered to cover the main body 101 to thereby form a tightly closed space 104 for processing the wafer W therein.

A plate 105 for which temperature regulation is not performed is disposed on the main body 101. Further, for example, three support pins 106 are provided capable of protruding and retracting from the front face of the plate 105. The support pins 106 are raised and lowered by a raising and lowering mechanism of which the illustration is omitted.

An exhaust port 107 is provided at the top of the lid body 103, and a vacuum pump 109 is connected to the exhaust port 107 via a pressure regulating valve 108. A gas introduction port 110 is provided at the side portion of the lid body 103, and a helium gas cylinder 113 is connected to the gas introduction port 110 via a temperature regulating mechanism 111 and a valve 112 for regulating an amount of gas introduction.

A controller 114 controls the opening/closing of the valves 108 and 112, temperature management of the temperature regulating mechanism 111, the driving of other portions, and the like. The controller 114 controls the temperature and the amount of helium gas introduced from the gas introduction port 110 and further the degree of vacuum in the tightly closed space 104 to a temperature and a pressure at levels at which a thinner contained in the resist applied to the wafer W volatilizes and an acid generator, a quencher, and a polymer chain protecting group practically remain in the resist, for example, during the processing.

It should be noted that the apparatus, to which the present invention is applied, for performing heat processing for the semiconductor wafer coated with the resist has been explained in the above-described embodiments, and the present invention can be applied to an apparatus for performing heat processing for another substrate, for example, an LCD substrate in addition to the semiconductor substrate.

As has been described, according to the present invention, the thermal processing can be performed for the substrate so that the acid generator is uniformly dispersed in the resist, or the dissolution inhibitor is uniformly formed on the front face of the resist without breakage of the polymer chain protecting group. Further, $O_2$, $O_3$, or the like is prevented from adhering to the front face of the resist after heat processing.

The disclosure of Japanese Patent Application No.2000-93757 filed Mar. 30, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus for performing a heat processing for a substrate coated with a resist containing at least one substance out of an acid generator, a dissolution inhibitor, and a polymer chain protecting group, and a solvent, comprising:
   a processing chamber having a space capable of being tightly closed;
   a plate disposed in the space for mounting thereon the substrate coated with the resist;
   a pressure reducing device for reducing a pressure in the tightly closed space; and
   a first controller for controlling the pressure reducing device to hold a pressure at a level at which the solvent contained in the resist volatilizes and the substance practically remains in the resist.

2. The substrate processing apparatus, as set forth in claim 1,
   a heater for heating the plate,
   wherein the first controller controls the heater to hold a temperature at levels at which the solvent contained in the resist volatilizes and the substance practically remains in the resist.

3. The substrate processing apparatus, as set forth in claim 1, further comprising:
   a cooling device provided in the space for performing a cooling processing for the substrate, and
   a second controller for controlling the cooling device to hold a temperature at a level at which the solvent contained in the resist volatilizes and the substance practically remains in the resist.

4. The substrate processing apparatus, as set forth in claim 2, further comprising:
   a purging device for purging the tightly closed space with a first inert gas while heating the plate with the heater.

5. An apparatus as set forth in claim 4,
   wherein the first inert gas is a nitrogen gas.

6. An apparatus as set forth in claim 2, further comprising:
   a gas inflow mechanism for flowing a second inert gas for a heat conduction into the tightly closed space.

7. An apparatus as set forth in claim 6,
   wherein the second inert gas is a helium gas.

8. An apparatus as set forth in claim 6, further comprising:
   a member for holding/supporting the substrate while keeping it away from a top of the plate,
   wherein the gas inflow mechanism flows the second inert gas into a clearance between the hot plate and the substrate.

9. An apparatus as set forth in claim 1, further comprising:
   a temperature regulation gas inflow mechanism for flowing a temperature regulated third inert gas into the tightly closed space,
   wherein the controller controls the pressure reducing device and a temperature of the third inert gas to hold a pressure and a temperature at levels at which the solvent contained in the resist volatilizes and the substance practically remains in the resist.

10. An apparatus as set forth in claim 1, further comprising:
    an opposing member closely opposing the substrate mounted on the plate and made of a material with a low heat conductivity.

11. An apparatus as set forth in claim 10,
    wherein a gap between the substrate mounted on the plate and the opposing member is approximately 1 mm.

12. An apparatus as set forth in claim 10,
    wherein the opposing member is made of a high density polyethylene.

13. An apparatus as set forth in claim 10,
    wherein the opposing member is made of a crystal.

14. The substrate processing apparatus, as set forth in claim 1,
    wherein the pressure reducing device has a pump for reducing a pressure inside the space, and a valve for regulating the pressure while reducing the pressure using the pump, so that the pressure is gradually reduced in a manner not to create a bumping in the resist.

15. A substrate processing apparatus for performing a processing for a substrate coated with a resist containing at least one substance out of an acid generator, a dissolution inhibitor, and a polymer chain protecting group, and a solvent, comprising:
    a processing chamber having a space capable of being tightly closed;
    a processing plate disposed in the space for processing the substrate coated with the resist at a room temperature or less;
    a pressure reducing device for reducing a pressure in the tightly closed space; and
    a controller for controlling a temperature of the processing plate and a degree of vacuum in the space to hold a temperature and a pressure at levels at which the solvent contained in the resist volatilizes, and the substance practically remains in the resist.

16. The substrate processing apparatus as set forth in claim 2,
    wherein the first controller controls the pressure to be approximately 5 Torr and the temperature to be approximately in a range of 40 C. and 50 C.

17. The substrate processing apparatus as set forth in claim 3,
    wherein the second controller controls the pressure to be approximately 2 Torr and the temperature to be approximately 23 C.

18. The substrate processing apparatus as set forth in claim 14,
    wherein the pressure reducing device gradually reduces the pressure using the valve at a rate of approximately 10 Torr/sec to 300 Torr/sec.

19. The substrate processing apparatus as set forth in claim 1, further comprising:
    a vacuum gauge for measuring a pressure inside the processing chamber,
    wherein the first controller controls the pressure reducing device according to the measured result of the vacuum gauge.

20. The substrate processing apparatus as set forth in claim 1, further comprising:
    a heater for heating the plate; and
    a thermometer for measuring a temperature inside the processing chamber;
    wherein the first controller controls the heater according to the measured result of the thermometer.

* * * * *

UNITED STATES PATENT AND TRADEMARK OFFICE
CERTIFICATE OF CORRECTION

PATENT NO.    : 6,633,022 B2
DATED         : October 14, 2003
INVENTOR(S)   : Takahiro Kitano et al.

It is certified that error appears in the above-identified patent and that said Letters Patent is hereby corrected as shown below:

Column 10,
Line 38, please change both occurrence of "C" to -- ºC --; and
Line 43, please change "C" to -- ºC --.

Signed and Sealed this

Thirtieth Day of March, 2004

JON W. DUDAS
*Acting Director of the United States Patent and Trademark Office*